US005773720A

United States Patent [19]
Miyata

[11] Patent Number: 5,773,720
[45] Date of Patent: Jun. 30, 1998

[54] IMPACT SENSOR AND MANUFACTURING METHOD THEREFOR

[75] Inventor: Toshio Miyata, Tokyo, Japan

[73] Assignee: Oki Electric Industry Co., Ltd., Tokyo, Japan

[21] Appl. No.: 790,283

[22] Filed: Jan. 28, 1997

[30] Foreign Application Priority Data

Apr. 5, 1996 [JP] Japan .................................. 8-083860

[51] Int. Cl.$^6$ ...................................................... G01L 7/08
[52] U.S. Cl. ............................................................ 73/493
[58] Field of Search ............... 73/866.5, 514.35–514.37, 73/514.01, 493, 494; 29/595, 825, 845, 844, 842, 505, 509; 310/338, 348

[56] References Cited

U.S. PATENT DOCUMENTS

| | | | |
|---|---|---|---|
| 3,414,704 | 12/1968 | Flanagan | 310/348 |
| 4,075,759 | 2/1978 | Sochor | 29/845 |
| 4,691,575 | 9/1987 | Sonderegger et al. | 29/595 |
| 5,392,012 | 2/1995 | Iwata et al. | 310/348 |
| 5,411,418 | 5/1995 | Welsh et al. | 29/845 |

*Primary Examiner*—Robert Raevis
*Attorney, Agent, or Firm*—Spencer & Frank

[57] ABSTRACT

An impact sensor 10 has mounting pins which are strongly fixed to a housing body 11 without having to increase the outside dimensions of the housing body. The impact sensor includes the housing body 11, which has a hollow space 12 for accommodating a sensing mechanism, and a mounting arrangement 17 for fixing the housing body 11 to a wiring board 13. The mounting arrangement 17 includes a first pin portion 17a, a second pin portion 17b extending from the first pin portion at right angles with the longitudinal direction thereof, and a third pin portion 17c extending from the first pin portion 17a in the opposite direction from the extending direction of the second pin portion. On each side of the housing body 11, a press-fit recess 16 is formed into which the first and second pin portions 17a and 17b are press-fitted. The housing body 11 is fixed to the wiring board 13 by those portions of the third pin portions 17c of the mounting arrangement 17 which protrude from the housing body 11.

19 Claims, 5 Drawing Sheets

PRIOR ART

Fig. 5(b)

PRIOR ART

5,773,720

IMPACT SENSOR AND MANUFACTURING METHOD THEREFOR

BACKGROUND OF THE INVENTION

1. Field of the Invention

The present invention relates to an impact sensor, and more particularly to an impact sensor suitable for use in the air bag system assembled in an automobile.

2. Prior Art

In the air bag system in an automobile, the impact sensor senses an impact from a car crash. The impact sensor outputs an impact detection signal to start the actuating device of the air bag to thereby inflate the air bag to secure the safety of the driver and fellow passengers.

An impact sensor of this kind is mounted on a wiring board incorporated in the electric system of an automobile. If the mounting strength of the impact sensor to the wiring board is weak, troubles occur such as the whole of the sensor becoming shaky on the wiring board upon impact from a collision, which may cause the cable terminals of the sensor to be disconnected from the wiring board.

Particularly, if the connection of the impact sensor housing body and the wiring board is loose, the collision impact is relaxed at the connection. Therefore, the impact sensor mechanism in the housing body cannot detect an impact accurately, and is unable to operate accurately.

For this reason, the housing body is connected firmly to the wiring board by soldering a total of four mounting pins arranged in pairs at both end portions thereof and projecting from the bottom face of the housing body. The impact sensor is thus fixed to the wiring board by the mounting pins with high rigidity.

Incidentally, even if the mounting pins provided for the housing body are fixed firmly to the wiring board, unless the mounting pins are connected rigidly to the housing body, the impact sensor in the housing body is not expected to perform accurately. On that account, there has been demand for an increase in the connection strength of the mounting pins to the housing body.

Among the four mounting pins provided for the housing body, a pair of mounting pins arranged at one end portion of the housing body serve also as the electrode terminals of the impact sensor mechanism accommodated in a hollow space in the center of the housing body. The electrode terminals are provided at that portion of the housing body where the hollow space for accommodating the impact sensor does not extend.

Therefore, by increasing the length of the electrode terminals in the housing body, the contact area between the electrode terminals and the housing body can be increased and the connection strength between them can be improved.

On the other hand, a pair of mounting pins provided at the other end portion of the housing body are the fixing pins dedicated to mounting of the housing body to the wiring board. In the other end portion where the hollow space for accommodating the impact sensor mechanism extends, it is not easy to increase the length of the fixing pins in the presence of the hollow space without incurring a size increase of the housing body.

Figure 5A:
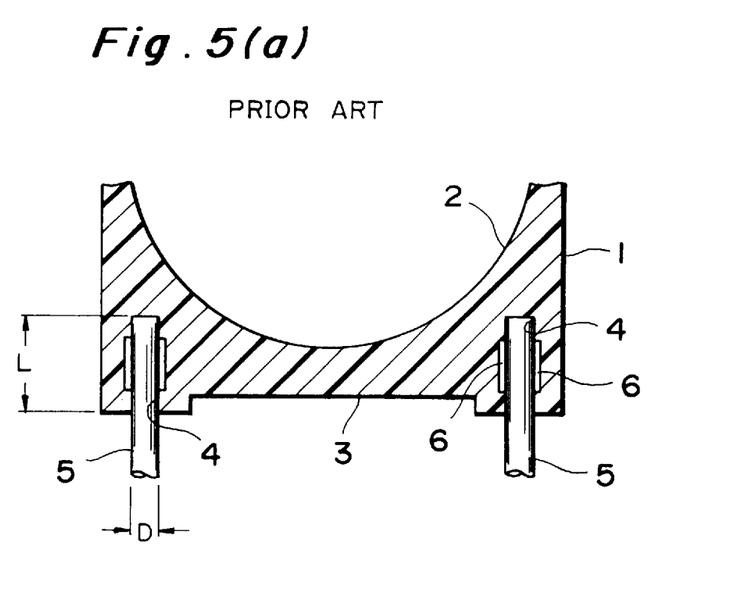
FIG. 5(a) is a diagram similar to FIG. 1(a), and shows a conventional impact sensor.
Figure 5B:
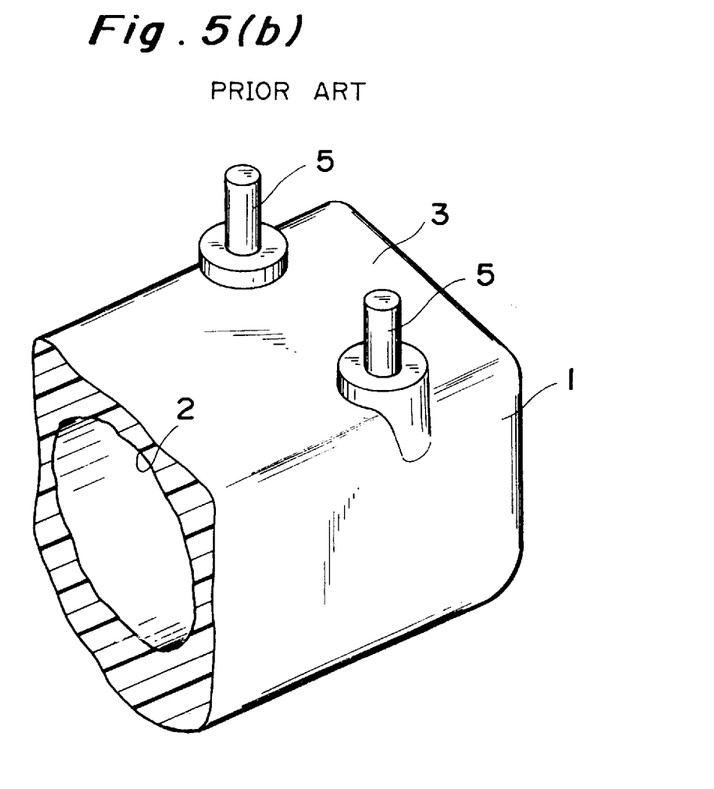
FIG. 5(b) is a diagram similar to FIG. 1(b), and shows the impact sensor depicted in FIG. 5(a).

FIGS. 5(a) and 5(b) are diagrams for explaining the conventional structure for mounting the fixing pins. FIG. 5(a) is a transverse cross section showing its principal portion, and FIG. 5(b) is a perspective view showing a part of the principal portion.

The housing body shown in FIGS. 5(a) and 5(b) is formed of a resin material superior in heat resistance, which is called an engineering plastic, such as a PBT (polybutylene terephthalate) resin. Inside the housing body 1, a cylindrical hollow space 2 for accommodating a sensor mechanism (not shown) for detecting an impact is provided. In the bottom face of the housing body 1, which serves as the face for mounting to the wiring board, not shown, there are provided a pair of press-fit recesses 4 open to the outside. In relation to the press-fit recesses 4, a pair of fixing terminals dedicated to fixing to the housing body, namely, a pair of fixing pins are provided. The fixing pins 5, which are circular in cross section, are press-fitted in the press-fit recesses 4 at one side portion of the housing body. A raised portion 6 is formed as a pull-out stopper by caulking at a part of the external circumferential surface of that portion of each fixing pin which is press-fit into the recess 4.

In the case of the fixing pins 5 provided at the other end portion of the housing body 1, there is the hollow space 2 extending above the recesses 4 into which the fixing pins 5 are inserted as shown in FIG. 5(a). Therefore, the height of the thick-walled portions of the housing body 1 where the recesses 4 are formed needs to be increased to increase the length L of the fixing pins 5 in order to further improve the connection strength of the fixing pins 5 to the housing body 1.

Moreover, also by increasing the diameter D of the fixing pins 5, the area of contact between the pins and housing body 1 can be increased. However, to increase the diameter D of the fixing pins 5, as in the increase of their length L, it is necessary to increase the width of the thick-walled portions of the housing body 1 where the recesses 4 are formed.

Consequently, in the conventional impact sensor, if the diameter or the length of the fixing pins is increased to increase the contact area between the fixing pins and the housing body to thereby increase their connection strength, the size of the housing body becomes large.

SUMMARY OF THE INVENTION

The present invention has been made to solve the above problem and has as its object to provide an impact sensor capable of improving the coupling strength between the housing body and the fixing pins without increasing the size of the housing body.

Another object of the present invention is to provide an impact sensor superior in operational reliability.

Yet another object of the present invention is to provide an impact sensor manufacturing method capable of relatively easily manufacturing an impact sensor superior in operational reliability.

These objects can be attained by providing an impact sensor comprising a housing body having defined a hollow space for accommodating a sensor mechanism for detecting an impact; and mounting means for fixing the housing body to a wiring board, wherein the mounting means comprises a first pin portion; a second pin portion extending from the first pin portion in a direction at right angles with the longitudinal direction thereof; and a third pin portion extending from the first pin portion in the opposite direction from the extending direction of the second pin portion, wherein on each side of the housing body, a press-fit recess is formed to have the first and second pin portions press-fitted into, and wherein the housing body is fixed to a wiring board by those portions of the third pin portions of the mounting means which protrude from the housing body.

In the impact sensor according to the present invention, the mounting means for fixing the housing body to the wiring board comprises the first and second pin portions press-fitted into the recess. By this arrangement of the first and second pin portions, their contact area with the housing body can be increased without being subject to the restriction by the presence of the hollow space in the housing body.

Therefore, according to the present invention, by making effective use of the thick-walled portions on both sides of the housing body, the contact area between the mounting means and the housing body can be increased without increasing the dimensions in the height and width directions of the thick-walled portions.

The press-fit recess into which the mounting means is press-fitted may be formed of a first or upright recess portion opening at the bottom face of the housing body and extending along the side face of the housing body and toward the bottom face to receive the second pin portion, and a second or level recess portion being continuous to the upright recess portion and extending at the bottom face to receive the first pin portion from the bottom face side.

The mounting means may be formed of a pair of mounting pins each in the form of a crank. In addition, the mounting means may be formed of a pair of mounting pins each in a T-like configuration. Furthermore, the mounting means may be formed of mounting pins each in an almost H-like configuration.

The connection between the housing body and the mounting pins can be further strengthened by forming the mounting means of mounting pins each in an almost H-like configuration with the first pin portion placed between the second and third pin portions, by thermally deforming the periphery of each level recess portion of the housing body to receive the first pin portion of each mounting pin, and by covering the first pin portion of each mounting pin with the peripheral portion of each second or level recess portion.

On the mounting means, a well-known projection as a pull-out stopper may be formed to prevent the pin from becoming loose.

According to the present invention, by providing the mounting means with the first pin portion, the heat capacity can be increased without increasing the overall length of the mounting means. This increase in the heat capacity serves to prevent a temperature rise of that portion of the housing body which surrounds the first and second pin portions of the mounting means when the mounting means is fixed to the wiring board by soldering. In short, a temperature rise of the press-fit recess can be prevented. Therefore, according to the present invention, it is possible to certainly prevent the mounting means from becoming loose, which is caused by the softening of the press-fit recess attending on the temperature rise in the press-fit recess of the housing body.

A method of manufacturing an impact sensor according to the present invention, (wherein the impact sensor includes a housing body having a hollow space defined therein for accommodating a sensor for detecting an impact; and a pair of mounting pins for fixing the housing body to a wiring board having insertion holes, each mounting pin including a first pin portion, a second pin portion extending into the housing body from the first pin portion at right angles with the longitudinal direction thereof, and a third pin portion extending from the first pin portion in the opposite direction from the extending direction of the second pin portion, and wherein the impact sensor is fixed to the wiring board by the second pin portion press-fitted into the housing body and the third pin portion extending from the first pin portion) comprises the steps of forming the pair of mounting pins and a tie-bar for partially connecting the two mounting pins spaced a specified distance in one monolithic body; press-fitting the pair of mounting pins connected through the tie-bar into the housing body; and subsequently separating the tie-bar from the mounting pins.

In the impact sensor manufacturing method according to the present invention, a pair of mounting pins are formed in a monolithic body under the condition that the mounting pins are connected spaced a predetermined distance through the intermediary of a tie-bar.

For this reason, a pair of mounting pins can be press-fitted into corresponding press-fit recesses relatively easily so that the mounting pins are connected to the housing body relatively firmly without using a special assembly device or jig, which heretofore has been used to maintain the separately-formed mounting pins spaced a specified distance.

Therefore, it becomes possible to manufacture an impact sensor superior in operational reliability with relative ease.

DESCRIPTION OF PREFERRED EMBODIMENTS

Embodiments of the present invention will be described in detail with reference to the accompanying drawings.

Figure 1A:
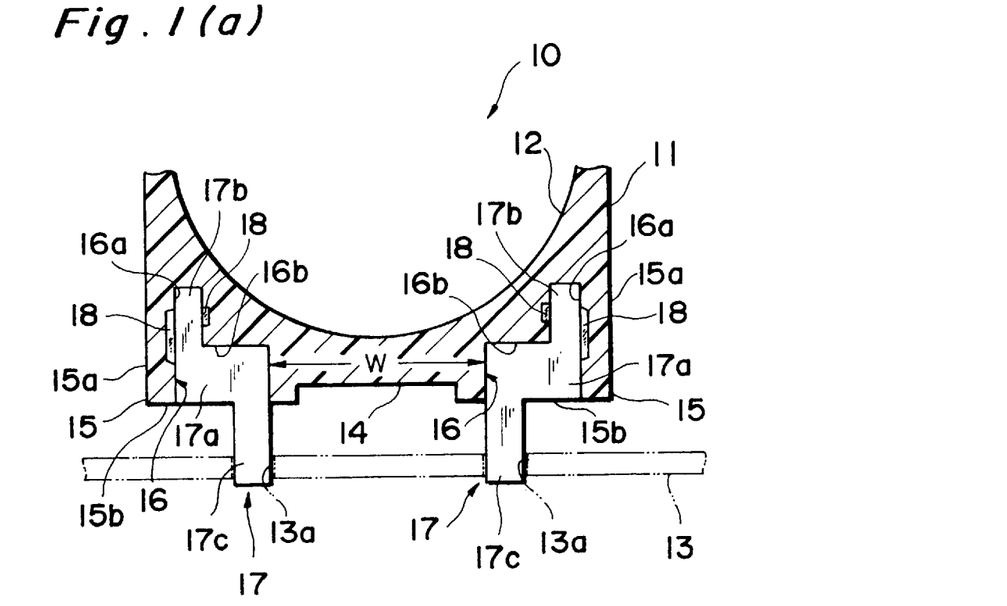
FIG. 1(a) is a cross sectional view partially showing a principal part of the impact sensor according to the present invention.
Figure 1B:
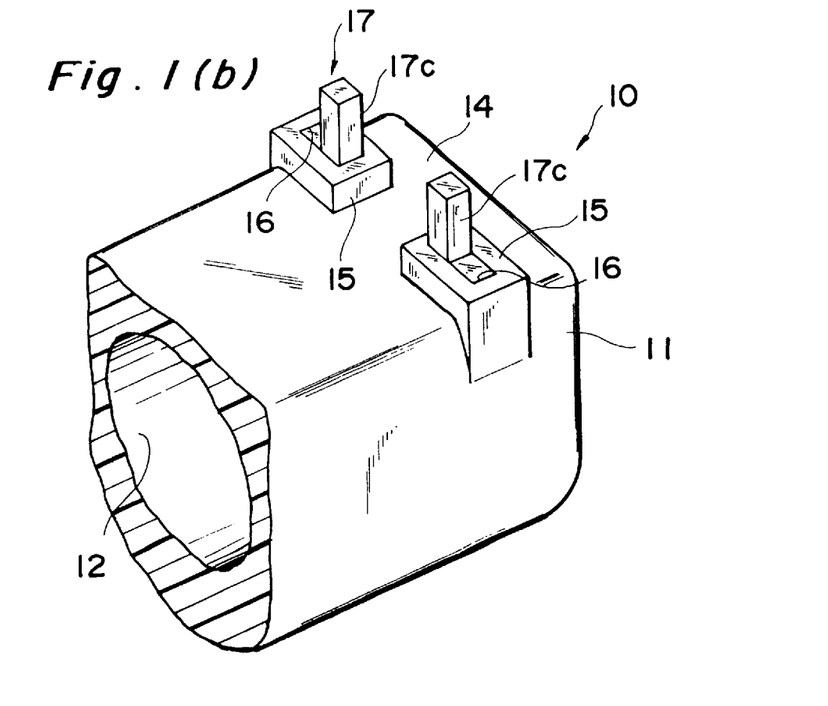
FIG. 1(b) is a perspective view partially showing a principal part of the impact sensor according to the present invention.

FIGS. 1(a) and 1(b) are diagrams for explaining a first embodiment of the impact sensor according to the present invention. FIG. 1(a) is a cross sectional view partially showing its principal part, and FIG. 1(b) is a perspective view partially showing the principal part.

The impact sensor 10 according to the present invention includes a housing body 11 as shown in FIGS. 1(a) and 1(b). The housing body is formed of a thermoplastic synthetic resin, a so-called engineering plastic, which exhibits heat resistance to temperatures of about 200° C., such as a PBT (polybutylene terephthalate) resin. In the inner part of the housing body 11, there is provided a generally cylindrical hollow space 12 for accommodating a sensor portion (not shown) for detecting an impact. The housing body 11 is mounted to a wiring board 13, and at the mounting face 14 of the housing body 11 for mounting to the wiring board 13, base portions 15 to be attached to the wiring board 13 are provided.

In the base portion 15, a pair of press-fit recesses 16 are formed which are separated for a predetermined pitch. Each press-fit recess 16 extends in the vertical direction of the housing body 11 along the side face 15a of the bottom face 15, namely, the base portion 15. Each press-fit recess 16 comprises an upright recess portion i.e. first recess portion 16a opening at the bottom face 15b of the base portion 15, and a level or second recess portion, in other words, a horizontal groove portion 16b being continuous to the upright recess portion 16a at its opening portion to the bottom face 15b, and extending along and opening at the bottom face 15b.

The upright recess portion 16a and the level or second recess portion 16b are formed substantially in a L-shape configuration in cross section as shown in FIG. 1(a), which corresponds in shape to a mounting pin 17 (in a crank form) to be described later.

For the sensor mechanism to be incorporated in the housing body 11, a well-known sensor mechanism can be adopted which includes, for example, a reed switch (not shown), a permanent magnet, and a coil spring member to apply a spring force to the permanent magnet to move it toward its non-acting position. The permanent magnet, upon receiving an impact force which overcomes the biasing force of the coil spring member, is displaced to the acting position where its magnetic force causes the reed switch to close their contacts.

This invention is not limited to this example, but any of various sensor mechanisms may be adopted.

A pair of fixing pins 17 as mounting means are press-fitted into the recesses or cavities 16 in the base portions 15 on one end portion of the housing body 11.

The pin 17 comprises a first or level pin portion 17a extending in the width direction of the housing body 11 and press-fitted into the level recess portion 16b of the recess 16 from the bottom face 15b, and a second pin portion 17b continuous to the outer end of the level pin portion 17a and extending in the upright recess portion 16a along the side face 15a of the housing body 11. At the inner end of the level pin portion 17a, a third pin portion 17c is provided which extends in the opposite direction from the second pin portion 17b. Consequently, the pin 17 assumes the shape of a crank.

The pin 17 is press-fitted into the recess 16, with the level pin portion 17a and the upright pin portion 17b being respectively inserted into the upright recess portion 16a and the level recess portion 16b of the recess 16. The distal end of the third pin portion 17c protrudes from the bottom face 15b of the housing body 11 and is inserted into the corresponding insertion hole 13a, and the upright pin portion 17c is firmly fixed to the wiring board 13 by soldering the distal end thereof.

Figure 2A:
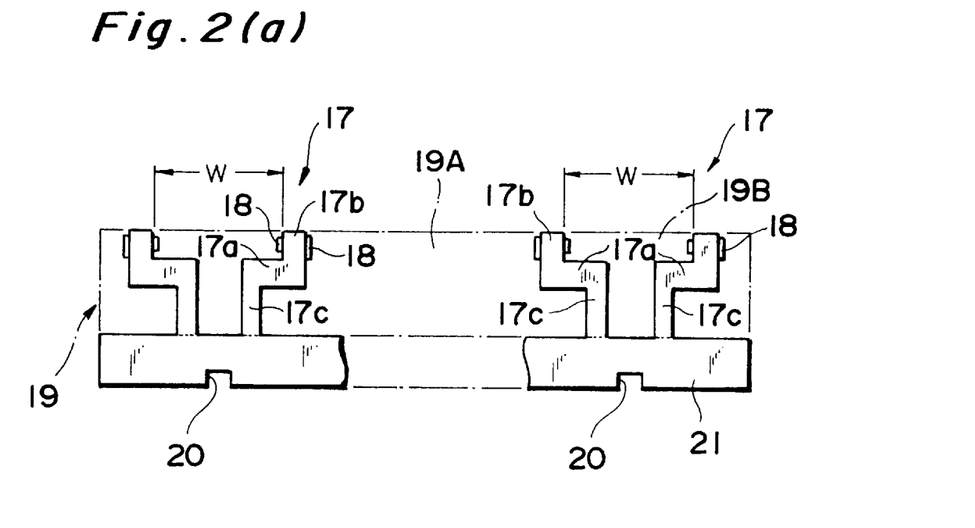
FIG. 2(a) is a plan view in the manufacturing process of the mounting pins showing the manufacturing method of the impact sensor depicted in FIGS. 1(a) and 1(b)
Figure 2B:
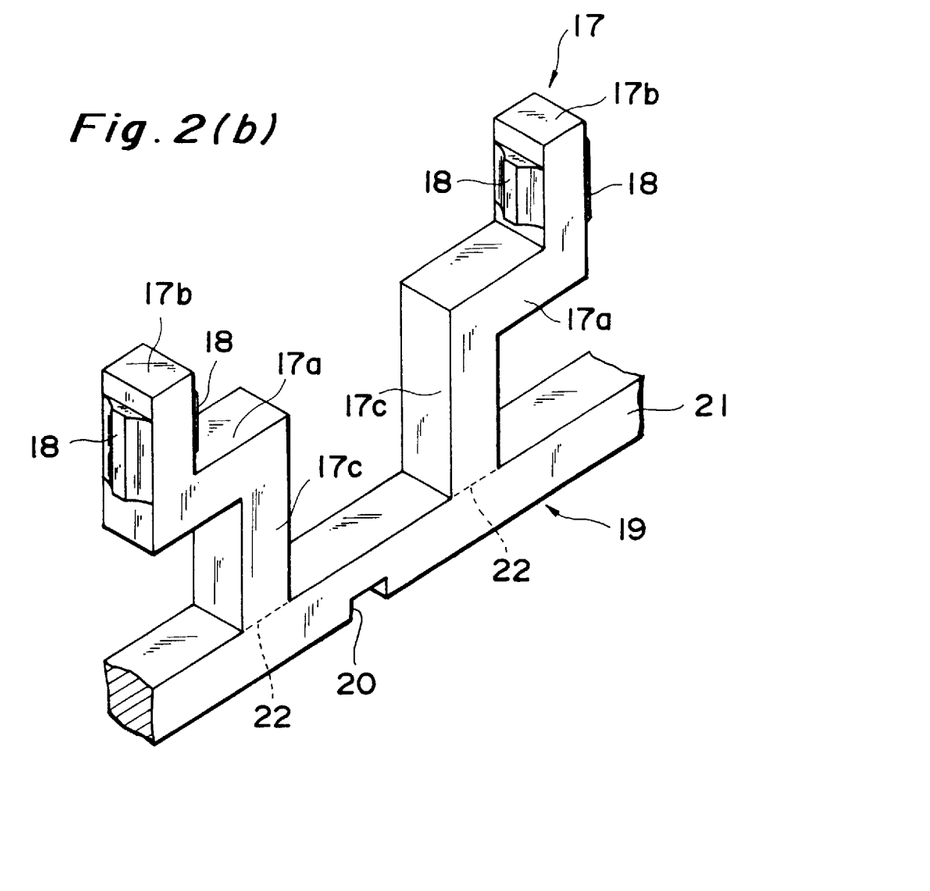
FIG. 2(b) is a perspective view of the mounting pins shown in FIG. 2(a)

In the example shown in FIG. 2(b), the mounting pin 17 is rectangular in cross section. Besides this, any other shape can be selected for its cross section, such as a conventional circular cross section.

On the second pin portion i.e. the upright pin portion 17b, a projection 18 may be formed which protrudes for a dimension of about 0.2 or 0.3 mm, for example. The projection serves to stop the pin 17 from becoming loose as it bites into the wall of the first upright recess portion 16a when the upright pin portion 17b is press-fitted into the recess portion 16a. The size of the projection 18 can be selected to suit the hardness of the resin material of the housing body 11 or other requirements, such as a press-fit allowance between the press-fit recess and the upright pin portion 17b of the pin 17. As for the number of the projections 18, with only one projection, sufficient pull-out prevention effect can be obtained. However, to retain a dynamic balance, projections 18 should preferably be formed in pairs in the width direction of the pins 17 as illustrated.

In the base portions (not shown) on the other end portion of the housing body 11, conventional straight mounting pins are provided which serve also as electrode terminals of the sensor mechanism, and which are at the distal ends thereof fixed firmly to the wiring board 13.

In the impact sensor 10 according to the present invention, a pair of mounting pins 17 only for fixing purposes, each substantially in a crank form, are press-fitted into the recesses 16. More specifically, each mounting pin has the level pin portion 17a and the upright pin portion 17b press-fitted into the recess 16, except for the third pin portion 17c. The recess 16, comprising the upright recess portion 16a and the level recess portion 16b for receiving the level pin portion 17a and the upright pin portion 17b, may be formed suitably in the thick-walled portion at a corner of the bottom portion 15 at one end portion of the housing body 11 without being subject to interference by the hollow space 12.

Therefore, the contact area between the pin 17 and the recess 16 into which the pin 17 is press-fitted can be increased without incurring an increase in the size of the housing body 11 due to increases of the height and width dimensions of the housing body 11. On account of this, the mounting strength of the pins 17 mounted to the housing body 11 can be improved. Consequently, the pins 17 can be prevented from becoming loose owing to a decrease in their rigidity to the housing body 1, and the operational reliability of the impact sensor can be redoubled.

In the first embodiment, mounting pins 17 shaped like a crank were adopted, but mounting pins of other shapes, T-like pins, for example, may be adopted which have the second and third portions 17b and 17c aligned on a straight line. More specifically, a pair of T-like pins dedicated to housing fixation are press-fitted into the press-fit recesses 16 shaped like those described above with their level pin portions 17a lying sideways and the feet of the T shapes directed to each other. Also in this example, as in the example shown in FIGS. 1(a) and 1(b), the contact area between the T-like mounting pins and the recesses 16 into which the pins are press-fitted can be increased without increasing the size of the housing body 11.

A description will now be presented of a manufacturing method of the impact sensor 10 shown in FIGS. 1(a) and 1(b).

A housing body 11, including a pair of recesses 16 described above, is formed by a well-known molding process, or the like. After molding of the housing body 11, in the hollow space 12 of the housing body 11, a sensor mechanism mentioned above is mounted. This mounting of the sensor mechanism into the housing body 11 may be performed before or after press-fitting into the recesses 16 of the housing body 11 of the mounting pins 17 dedicated to fixing to the housing body, which will be described later.

As shown in FIGS. 2(a) and 2(b), the mounting pins 17 dedicated to fixing to the housing body can be obtained by press working of a sheet 19 of Cu alloy, for example.

Grooves 20 for positioning are cut off from a metal sheet 19 by press working. Subsequently, as shown in FIGS. 2(a) and 2(b), using the grooves 20 as references, unnecessary portions 19A and 19B are cut off by press working to form multiple pairs of mounting pins 17 on a tie bar 21.

By cutting off the unnecessary portions 19A and 19B, mounting pins 17, each comprising a upright pin portion 17b with projections 18 for pull-out prevention, a level pin portion 17a, and a upright pin portion 17c, are formed on the tie bar 21 at predetermined intervals W, which correspond to the recesses 16.

The projections 18 are formed by pressure-deformation as clearly shown in FIG. 2(b). The projections 18 extend along the upright pin portions 17b, and are generally triangular in cross section. Being in this triangular shape, the projection 18 easily bites into the inner wall of the upright recess portion 16a when the upright pin portion 17b is press-fitted into the upright recess portion 16a of the recess or cavity 16.

The mounting pins 17 formed in pairs on the tie bar 21 are located at positions corresponding to the intervals W of the recesses 16 of the housing body 11. Therefore, the upright pin portions 17b can be easily inserted into the corresponding upright recess portions 16a of the recesses 16 without using a special positioning device.

Moreover, paired mounting pins 17 are formed each integrally with the tie bar 21, so that by applying a pressing force to the tie bar 21, the first upright pin portion 17b and the level pin portion 17a of the pair of mounting pins 17 can be simultaneously press-fitted into the upright recess portion 16a and the level recess portion 16b of the recess 16.

When press-fitting the mounting pins 17, the mounting pins 17 may be cut off in pairs from the tie bar 21 when necessary.

By simultaneous press-fitting of a pair of mounting pins 17 into recesses 16, a pair of mounting pins 17 are connected to the housing body 11. After the connection of the mounting pins 17 to the housing body 11, the mounting pins 17 are separated from the tie bar 21 at the cut-off line 22 shown in FIG. 2(b).

According to this manufacturing method, a pair of mounting pins 17 are tied together by the tie bar 21, and therefore the mounting pins 17 are press-fitted into the recess 16 of the housing body 11 while they are kept apart for a predetermined distance W. Therefore, the mounting pins 17 can be press-fitted into the housing body 11 with extremely high accuracy and with ease while maintaining the pitch and the parallelism between the mounting pins 17 without a special jig or adjustment. It has been conventionally necessary to press-fit mounting pins into the housing body one by one, but according to the present invention, a pair of mounting pins 17 can be press-fitted into the recesses 16 of the housing body 11 simultaneously, so that manufacturing man-hours can be curtailed, which is another advantage of this manufacturing method.

In the manufacturing method mentioned above, a case where multiple pairs of mounting pins 17 for fixing are formed by being tied together with a tie bar 21 has been described. However, only a single pair of mounting pins 17 for fixing may be connected with a tie bar 21. The working process to obtain a pair of mounting pins 17 connected with a tie bar 21 is not limited to the press working described above, but etching or other kinds of machine work may be adopted. However, press working should preferably be adopted if cost, the working accuracy of mounting pins 17 for fixing, and so on are taken into consideration.

Figure 3A:
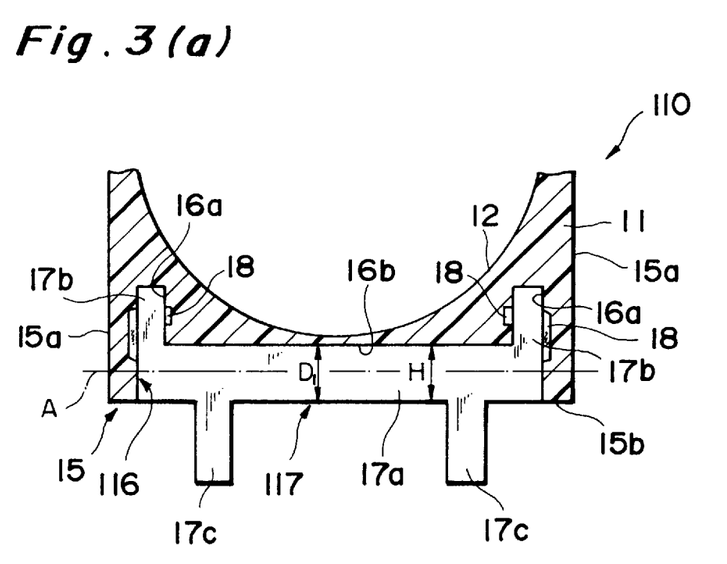
FIG. 3(a) is a diagram similar to FIG. 1(a), and shows another embodiment of the impact sensor according to the present invention.
Figure 3B:
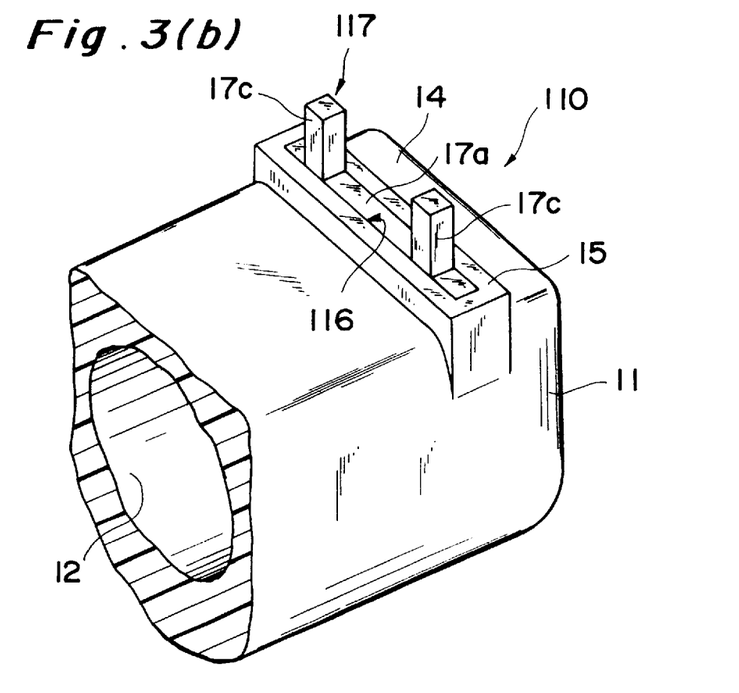
FIG. 3(b) is a diagram similar to FIG. 1(b), and shows the impact sensor depicted in FIG. 3(a)

FIGS. 3(a) and 3(b) are diagrams for explaining a second embodiment of the impact sensor according to the present invention. FIG. 3(a) is a cross sectional view partially showing its principal part, and FIG. 3(b) is a perspective view partially showing the principal part.

In the example shown in FIGS. 3(a) and 3(b), the impact sensor 110 comprises a single recess 116 including a pair of upright recess portions 16a and a level recess portion 16b connecting the pair of upright recess portions 16a in place of a pair of recesses 16 shown in FIGS. 1(a) and 1(b). A generally H-shaped mounting pin 117 to be press-fitted into the single recess 116 is used. Other functional parts similar to those in FIGS. 1(a) and 1(b) are designated by the same reference numerals.

In the impact sensor 110, the press-fit recess 116 comprises a pair of upright recess portions 16a extending along and opening at the side faces 15a of the bottom portion 15, and the two upright recess portions 16a are connected by the groove, in other words, the level recess portion 16b at the bottom face 15b.

The mounting pin 117 to be press-fitted into the recess 116 of the housing body 21 comprises a first pin portion i.e. level pin portion 17a to be press-fitted into the level recess portion 16b and a pair of second pin portions 17b extending at right angles with the axis A of the level pin portion 17a from both ends of the level pin portion 17a toward the corresponding upright recess portions 16a and press-fitted into the upright recess portions 16a. Projections 18 for pull-out prevention similar to those described earlier are formed on the upright pin portions 17b.

The level pin portion 17a of the mounting pin 117 has a pair of third pin portions 17c extending from the bottom face 15b of the housing body 11 in a direction opposite from the extending direction of the upright pin portions 17b.

As in the first embodiment, the impact sensor 110 has the distal ends of the upright pin portions 17c inserted into the insertion holes 13a of the wiring board 13 and has the distal ends of the upright pin portions 17c soldered to the wiring board 13.

In the example in FIGS. 3(a) and 3(b), in the generally H-shaped mounting pin 117 comprising a pair of the second pin portions 17b and a pair of the third pin portions 17c, the distance between the pair of the second pin portions 17b is set to be greater than that between the pair of the pair third pin portions 17c. The distance between the two pairs of the upright pin portions 17b and 17c can be varied when necessary. For example, the second and third pin portions 17b and 17c can be formed on the same prolonged line. In this example, the depth D1 of the level recess portion 16b of the recess 16 and the height H of the level pin portion 17a of the mounting pin to be press-fitted into the level recess portion 16b are set to be substantially the same.

According to this impact sensor 110, since the level pin portion 17a of the mounting pin 17 extends over almost all the region in the width direction of the housing body 11, the contact area between the housing body 11 and the mounting pin 117 can be made much longer than in the first embodiment. Therefore, the mounting pin 117 can be more firmly connected to the housing body 11.

Since a pair of the upright pin portions 17b are formed to be integral with the level pin portion 17a, when the mounting pin 117 is press-fitted into the housing body 11, the pitch and the parallelism between the two upright pin portions 17b are maintained with high accuracy, and in addition, the pitch and the parallelism between a pair of the upright pin portions 17c can be secured certainly with respect to the wiring board 13. For this reason, when an impact sensor 110 is mounted to the wiring board 13, the third pin portions 17c can be smoothly fit into the insertion holes 13a of the wiring board 13.

Furthermore, if the pitch between the insertion holes 13a of the wiring board 13 is changed, the housing body 11 can be made adaptable to the change on the side of the wiring board 13 simply by changing the pitch between the third pin portions 17c so as to correspond to the changed pitch of the insertion holes 13a by the use of a press die, for example, without making dimensional changes to the housing body 11 and the second pin portions 17b. Thus, it is possible to adapt to design changes on the wiring board side flexibly and at small cost.

Figure 4A:
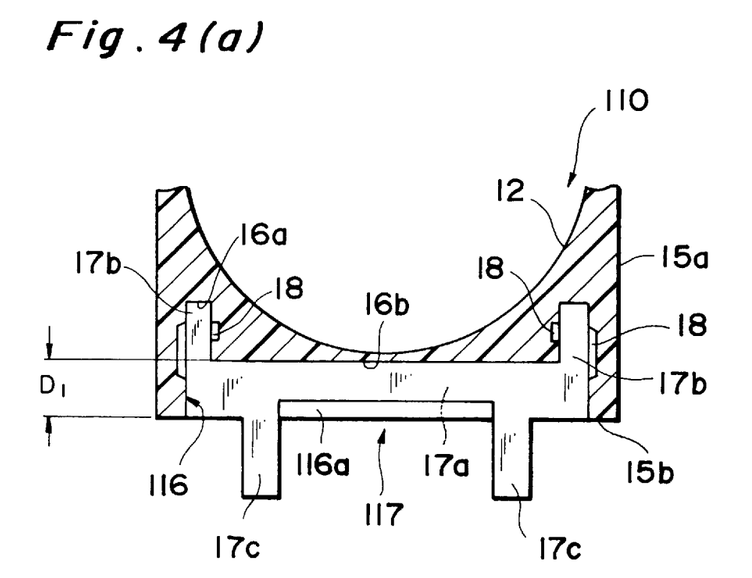
FIG. 4(a) is a diagram similar to FIG. 1(a), and shows yet another embodiment of the impact sensor according to the present invention.
Figure 4B:
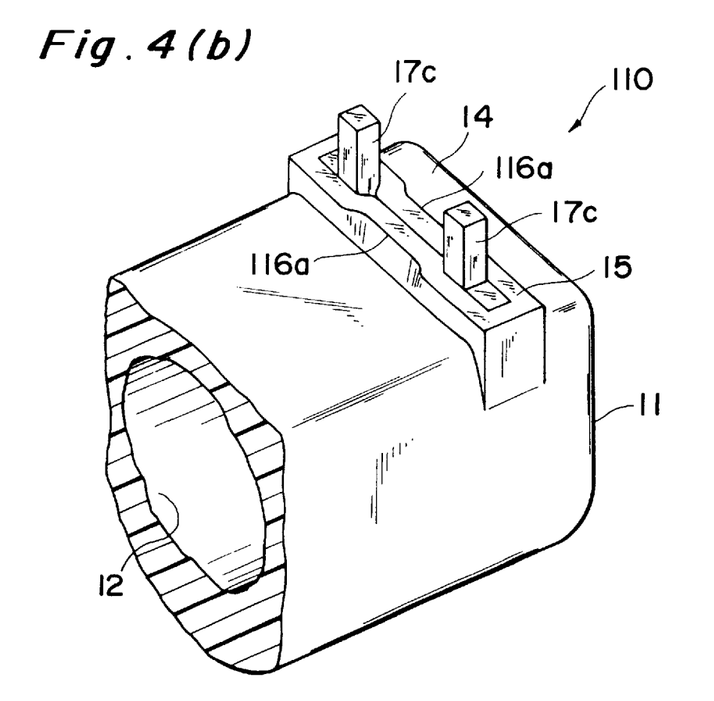
FIG. 4(b) is a diagram similar to FIG. 1(b), and shows the impact sensor depicted in FIG. 4(a)

FIGS. 4(a) and 4(b) are diagrams for explaining a third embodiment of the impact sensor according to the present invention. FIG. 4(a) is a cross sectional view showing its principal part, and FIG. 4(b) is a perspective view showing the principal part.

In the third embodiment, the height H of the level pin portion 17a between a pair of the upright pin portions 17c of the mounting pin 117 is set to be smaller than the depth D1 of the level recess portion 16b in contrast to the second embodiment shown in FIGS. 3(a) and 3(b). To be more concrete, the height H of the level pin portion 17a is preferably be about ½ to ⅔ of the depth D1 of the level recess portion 16b.

Therefore, as shown in FIG. 4(a), when the level pin portion 17a and a pair of the upright pin portions 17b of the mounting pin 117 are respectively press-fitted into the level recess portion 16b and a pair of the upright recess portions 16a of the recess 116, two flanges as peripheral portions 116a of the housing project downwardly beyond the level pin portion 17a.

The peripheral portions 116a projecting beyond the level pin portion 17a are pressed laterally as they are pinched between a pair of heating plates (not shown), for example. By the so-called thermal caulking by the heating plates, the two peripheral portions 116a are deformed so as to be joined together. By the deformation of the two peripheral portions 116a, the level pin portion 17a is partially buried in the housing body 11, so that the mounting pin 117 is more firmly fixed to the housing body 11.

By the thermal caulking of the two peripheral portions 116a, the coupling strength of the mounting pin 117 to the housing body 11 can be raised to a level equivalent to the breaking strength of the resin material of the housing body 11. In this fixing structure by thermal caulking, since the level pin portion 17a is covered with the housing resin material and insulated electrically, a wiring conductor pattern can be formed also in the region of the wiring board 13 which corresponds to the position of the level pin portion 17a.

For the cross sectional shape of the mounting pins 17 for fixing in each embodiment, besides a quadrangle, a square and a rectangle, circular or other polygonal shapes may be adopted. However, in order to secure a wide press-fit area between the housing body and the mounting pins for fixing, the quadrangle cross section shown in the accompanying drawings should preferably be adopted.

In the impact sensor according to the present invention, as described earlier, by making effective use of the thick-walled portions on both sides of the housing body, the contact area between the mounting means and the housing body can be increased without increasing the dimensions of the height direction and the width direction of the housing body. Therefore, the mounting strength of the mounting means to the housing body can be improved without incurring an enlargement of the impact sensor, for which reason the operational reliability of the impact sensor can be enhanced.

In the manufacturing method according to the present invention, as mentioned earlier, a pair of mounting pins are press-fitted into the housing body under the condition that they are connected spaced a predetermined distance through the intermediary of a tie bar, and therefore without the need to use a conventional, special assembly device or a jig for maintaining the pair of mounting pins spaced a predetermined distance, the pair of mounting pins can be easily press-fitted into the corresponding press-fit recess, and the mounting pins can be firmly connected to the housing body relatively easily. Thus, an impact sensor with excellent operation reliability can be manufactured relatively easily.

What is claimed is:

1. An impact sensor comprising:
   a housing body having a bottom face and having a hollow space defined in the housing body for accommodating a sensor mechanism for detecting an impact; and
   mounting means for fixing the housing body to a wiring board, the mounting means comprising a generally H-shaped mounting pin which includes a first pin portion extending along the bottom face of the housing body, a pair of second pin portions extending from the first pin portion in a direction at right angles with the longitudinal direction of the first pin portion, and a pair of third pin portions extending from the first pin portion in the opposite direction from the extending direction of the second pin portions,
   wherein the housing body has a press-fit recess and the first pin portion and the second pin portions are press-fitted into the recess, the first and second pin portions contacting tightly with surface portions of the recess, and
   wherein the housing body is fixed to the wiring board by portions of the third pin portions of the mounting means which extend from the housing body.

2. An impact sensor according to claim 1, wherein projections are formed on the second pin portions to prevent the mounting means from coming out of the housing body.

3. An impact sensor comprising:
   a housing body having a bottom face and having a hollow space defined in the housing body for accommodating a sensor mechanism for detecting an impact; and
   mounting means for fixing the housing body to a wiring board, the mounting means comprising a generally H-shaped mounting pin which includes a first pin portion extending along the bottom face of the housing body, a pair of second pin portions extending from the first pin portion in a direction at right angles with the longitudinal direction of the first pin portion, and a pair of third pin portions extending from the first pin portion in the opposite direction from the extending direction of the second pin portions,
   wherein the housing body comprises a bottom portion defined by the bottom face and a pair of side faces rising from both sides of the bottom face,
   wherein the housing body has a press-fit recess which comprises a pair of first recess portions extending along the side faces toward the bottom face to receive the second pin portions and opening at the bottom face, and a second recess portion that is continuous with the first recess portions and that extends along the bottom face to receive the first pin portion from the bottom face side, the first pin portion and the second pin portions being press-fitted into the recess and contacting tightly with surface portions of the recess,
   wherein the thickness of the first pin portion of the mounting pin is smaller than the depth of the second recess portion for receiving the first pin portion,
   wherein a peripheral portion defining the second recess portion in the bottom portion of the housing body projects beyond the first pin portion and the peripheral portion is deformed thermally to cover the first pin portion, and wherein the housing body is fixed to the wiring board by portions of the third pin portions of the mounting means which extend from the housing body.

4. An impact sensor, comprising:

a housing body for housing a sensor mechanism, the housing body having a bottom face with a recess, the recess having a horizontal portion and a vertical portion; and mounting means for fixing the housing body to a wiring board, the mounting means comprising a first pin portion which extends along the bottom face of the housing body and which is fixed in the horizontal portion of the recess, a second pin portion which extends from the first pin portion and which is fixed in the vertical portion of the recess, and a third pin portion which extends from the first pin portion and which is fixed to the wiring board, wherein the housing additionally has at least one flange adjacent the horizontal portion of the recess, and wherein the at least one flange is thermally deformed so as to at least partially cover the first pin portion.

5. An impact sensor, comprising:

a housing body for housing a sensor mechanism, the housing body having a bottom face with a recess; and mounting means for fixing the housing body to a wiring board, the mounting means comprising a first pin portion which extends along the bottom face of the housing body and which is fixed in the recess, a second pin portion which extends from the first pin portion and which is fixed in the recess, and a third pin portion which extends from the first pin portion and which is fixed to the wiring board, wherein the sensor mechanism is electrically isolated from the first, second, and third pin portions.

6. An impact sensor according to claim 5, wherein the housing body has left and right side faces, wherein the recess is a left recess that is disposed adjacent the left side face, wherein the bottom face of the housing body additionally has a right recess adjacent the right side face, wherein the first, second, and third pin portions are part of a unitary left mounting pin, and wherein the mounting means further comprises a unitary right mounting pin having a first pin portion which extends along the bottom face of the housing body and which is fixed in the right recess, a second pin portion which extends from the first pin portion of the right mounting pin and which is fixed in the right recess, and a third pin portion which extends from the first pin portion of the right mounting pin and which is fixed to the wiring board.

7. An impact sensor according to claim 5, wherein the second and third pin portions extend from opposite ends of the first pin portion and are perpendicular to the first pin portion.

8. An impact sensor according to claim 7, wherein the first pin portion has first and second ends, wherein the second pin portion extends from the second end, and wherein the third pin portion extends from one of the first and second ends.

9. An impact sensor according to claim 8, wherein the third pin portion extends from the first end of the first pin portion.

10. An impact sensor, comprising:

a housing body for housing a sensor mechanism, the housing body having a bottom face with a recess; and mounting means for fixing the housing body to a wiring board, the mounting means comprising a first pin portion which extends along the bottom face of the housing body and which is fixed in the recess, a second pin portion which extends from the first pin portion and which is fixed in the recess, and a third pin portion which extends from the first pin portion and which is fixed to the wiring board, wherein the housing body comprises plastic, wherein the first and second pin portions are press-fit into the recess, and wherein the second pin portion further comprises at least one projection for biting into the plastic.

11. An impact sensor according to claim 10, wherein the mounting means are a pair of mounting pins, each having first, second, and the third pin portions, with the second and third pin portions of each mounting pin extending from opposite ends of the first pin portion of the respective mounting pin.

12. An impact sensor according to claim 10, wherein the mounting means are a pair of mounting pins, each having first, second, and third pin portions, with the second and third pin portions of each mounting pin being arranged on a straight line and extending from a common end of the first pin portion of the respective mounting pin.

13. An impact sensor according to claim 10, wherein the mounting means is a generally H-shaped mounting pin comprising a pair of second pin portions and a pair of third pin portions formed on the first pin portion.

14. An impact sensor, comprising:

a housing body for housing a sensor mechanism, the housing body having left and right side faces, the housing body additionally having a bottom face with a left recess that is disposed adjacent the left side face and a right recess that is disposed adjacent the right side face; and mounting means for fixing the housing body to a wiring board, the mounting means comprising a unitary left mounting pin having a first pin portion which extends along the bottom face of the housing body and which is fixed in the left recess, a second pin portion which extends from the first pin portion and which is fixed in the left recess, and a third pin portion which extends from the first pin portion and which is fixed to the wiring board, the mounting means additionally comprising a unitary right mounting pin having a first pin portion which extends along the bottom face of the housing body and which is fixed in the right recess, a second pin portion which extends from the first pin portion of the right mounting pin and which is fixed in the right recess, and a third pin portion which extends from the first pin portion of the right mounting pin and which is fixed to the wiring board, wherein the third pin portion of the left mounting pin and the third pin portion of the right mounting pin both have outer ends that are severed from a common tie bar.

15. An impact sensor, comprising:

a housing body for housing a sensor mechanism, the housing body having a bottom face with a recess; and mounting means for fixing the housing body to a wiring board, the mounting means comprising a first pin portion which extends along the bottom face of the housing body and which is fixed in the recess, a second pin portion which extends from the first pin portion and which is fixed in the recess, and a third pin portion which extends from the first pin portion and which is fixed to the wiring board, wherein the first, second, and third pin portions are members of a unitary mounting pin which additionally has another second pin portion that extends from the first pin portion and another third pin portion that extends from the first pin portion, the mounting pin having a configuration that is generally H-shaped.

16. An impact sensor according to claim 15, wherein the recess is generally U-shaped, and has a bottom portion which receives the first pin portion and a spread-apart pair of rising portions which receive the second pin portions.

17. An impact sensor according to claim 16, wherein the housing additionally has at least one flange adjacent the bottom portion of the recess, the at least one flange being thermally deformed so as to at least partially cover the first pin portion.

18. An impact sensor, comprising:
a housing body having a hollow space defined therein for accommodating a sensor mechanism for detecting an impact; and
mounting means for fixing the housing body to a wiring board, the mounting means comprising a generally H-shaped mounting pin having a first pin portion, a pair of second pin portions extending from the first pin portion in a direction at right angles with the longitudinal direction of the first pin portion, and a pair of third pin portions extending from the first pin portion in the opposite direction from the extending direction of the second pin portions,
wherein the housing body has a press-fit recess and the first and second pin portions are press-fitted into the press-fit recess, with the second pin portions extending into parts of the press-fit recess that are located adjacent each side of the housing body, and
wherein the housing body is fixed to the wiring board by portions of the third pin portions of the mounting means which extend from the housing body.

19. An impact sensor, comprising:
a housing body having a hollow space defined therein for accommodating a sensor mechanism for detecting an impact, the housing body additionally having a bottom portion defined by a bottom face and a pair of side faces rising from both sides of the bottom face, and
mounting means for fixing the housing body to a wiring board, the mounting means comprising a generally H-shaped mounting pin having a first pin portion, a pair of second pin portions extending from the first pin portion in a direction at right angles with the longitudinal direction of the first pin portion, and a pair of third pin portions extending from the first pin portion in the opposite direction from the extending direction of the second pin portions,
wherein the housing body has a press-fit recess and the first and second pin portions are press-fitted into the press-fit recess, the press-fit recess including first recess portions which open at the bottom face and which extend into the housing body adjacent the side faces to receive the second pin portions, and a second recess portion which is continuous with the first recess portions and which extends along the bottom face to receive the first pin portion,
wherein the housing body is fixed to the wiring board by those portions of the third pin portions of the mounting means which extend from the housing body,
wherein the first pin portion of the mounting pin has a thickness that is smaller than the depth of the second recess portion in which the first pin portion is received, and
wherein the bottom portion of the housing body has a peripheral portion defining the second recess portion, the peripheral portion projecting beyond the first pin portion and being deformed thermally to cover the first pin portion.

* * * * *